(12) United States Patent
Staros et al.

(10) Patent No.: US 8,671,127 B2
(45) Date of Patent: Mar. 11, 2014

(54) METHOD FOR REDUCING DIGITAL FILTER COEFFICIENT WORD SIZE AND APPARATUS THEREFOR

(75) Inventors: Theodore Basil Staros, Carlsbad, CA (US); John Crawford LeVieux, Carlsbad, CA (US)

(73) Assignee: HBC Solutions, Inc., Englewood, CO (US)

( * ) Notice: Subject to any disclaimer, the term of this patent is extended or adjusted under 35 U.S.C. 154(b) by 1863 days.

(21) Appl. No.: 11/934,233

(22) Filed: Nov. 2, 2007

(65) Prior Publication Data
US 2009/0119356 A1    May 7, 2009

(51) Int. Cl.
*G06F 17/10* (2006.01)

(52) U.S. Cl.
USPC .......................................................... 708/300

(58) Field of Classification Search
None
See application file for complete search history.

(56) References Cited

U.S. PATENT DOCUMENTS

| | | | |
|---|---|---|---|
| 4,524,422 A * | 6/1985 | Kasuga | 708/323 |
| 4,524,433 A | 6/1985 | Broding | |
| 5,541,866 A | 7/1996 | Sato et al. | |
| 5,827,987 A | 10/1998 | Kosugi | |
| 7,346,638 B2 * | 3/2008 | Lin et al. | 708/300 |
| 2002/0118739 A1 | 8/2002 | Schier et al. | |
| 2006/0141957 A1 | 6/2006 | Fischer et al. | |

* cited by examiner

*Primary Examiner* — Michael D Yaary

(74) *Attorney, Agent, or Firm* — Tarolli, Sundheim, Covell & Tummino LLP

(57) ABSTRACT

Electronic component resource utilization for certain digital filters may be significantly reduced by using a method for determining a set of coefficient words using a smaller word size. The disclosed method and/or apparatus may be used to determine an initial set of coefficient words for a digital filter for a predetermined frequency, a predetermined quality factor ("Q"), and a predetermined sampling frequency, and determining a gain error value for the digital filter for the set of coefficient words. If the determined gain error value is greater than a predetermined threshold, the quality factor may be modified by multiple predetermined amounts. The set of coefficient words may be redetermined using the modified quality factors as often as necessary until the gain error drops below the predetermined threshold.

37 Claims, 6 Drawing Sheets

METHOD FOR REDUCING DIGITAL FILTER COEFFICIENT WORD SIZE AND APPARATUS THEREFOR

BACKGROUND

The use of digital filters is widespread for a number of reasons, not least of which is that a digital filter can perform filtering functions that may not be practically realizable with analog filters. Digital filters may be employed in signal processing circuitry as well as other circuits where the filtering effect can be expressed as a mathematical function or algorithm. In a typical application, the digital filter modifies an intermediate form of a signal by performing a mathematical operation (e.g., multiplication, addition, etc.) in which a coefficient is combined mathematically with the intermediate signal, or a portion thereof. Usually, there is more than one coefficient being mathematically combined with more than one portion of the signal and hence a set of these coefficients may be used to form a digital filter. The term "coefficient word" may be used to refer to a number having a specific number of binary digits (i.e., "bits"). Digital filters are typically designed with certain design criteria in mind, such as the operating frequency of the filter, a known quality factor ("Q") of the filter, and a known sampling frequency. Using these criteria, a set of coefficient words can be determined to achieve the necessary filtering of a signal.

However, as digital filters are implemented in applications that require increasingly larger coefficient words, more hardware resources, and therefore higher cost, are required to realize the digital filter. For example, the audio frequency range is nominally taken to span the range from 20 Hz to 20 KHz. Typical digital audio sample rates may be 44.1 KHz, 48 KHz or higher. Using 48 KHz as a nonlimiting example, the ratio of the Nyquist limit frequency (24 KHz) to the minimum frequency in the audio frequency range (20 Hz) is 1200 to 1. When designing a digital filter with such a wide frequency ratio, large coefficient word sizes are necessary in order to prevent undesired gain error in the filter response, typically at the lowest of frequencies.

The variety of applications for digital filters continues to grow as the speed, size, complexity, and usefulness of digital filters are improved. Some of these applications include audio filters, video filters, cell phones, radios, transmitters, receivers, motor controllers, audio compact disc players, etc. Digital filters with large coefficient word sizes may require more complex and expensive field programmable gate arrays ("FPGAs"), more costly microprocessors that can operated with large coefficient word sizes, or may require designing circuitry with double the number of components in order to accommodate large coefficient word sizes. In these and other applications, it is highly desirable to minimize the use of hardware resources and so rein in the cost of the digital filter and therefore the overall cost of the device.

Accordingly, it is an object of the present disclosure to implement a method and apparatus wherein the use of a smaller coefficient word size can be realized so as to avoid having to incur the cost associated with using additional hardware resources while maintaining an acceptable gain error in the filter response.

It is another object of the present disclosure to determine a set of coefficient words for a digital filter by determining a set of coefficient words for the digital filter for a predetermined frequency, a predetermined quality factor ("Q"), and a predetermined sampling frequency, determining a gain error value for the digital filter for the set of coefficient words, and modifying the quality factor by a predetermined amount and redetermining the set of coefficient words using the modified quality factor if the determined gain error value is greater than a predetermined threshold.

It is yet another object of the present disclosure to determine sets of coefficient words for a digital filter by determining a set of coefficient words for the digital filter for a predetermined frequency value, a predetermined quality factor, and a predetermined sampling frequency, determining a gain error value for the digital filter for the set of coefficient words, if said predetermined frequency value is less than a predetermined frequency threshold and the determined gain error value is greater than a predetermined gain error threshold, modifying the quality factor by a predetermined amount and repeating the above steps using the modified quality factor, and changing the predetermined frequency value by a predetermined amount to thereby form a new frequency value and repeating the above steps using the new frequency value if the new frequency value is within a predetermined frequency band.

It is still another object of the present disclosure to determine a set of coefficient words for a digital filter using an apparatus which includes a digital filter, circuitry for determining a set of coefficient words for the digital filter for a predetermined frequency, a predetermined quality factor, and a predetermined sampling frequency, circuitry for determining a gain error value for the digital filter for the set of coefficient words, and circuitry for modifying the quality factor by a predetermined amount and redetermining the set of coefficient words using the modified quality factor if the determined gain error value is greater than a predetermined threshold.

These and many other advantages of the present disclosure will be readily apparent to one skilled in the art to which the disclosure pertains from a perusal of the claims, the appended drawings, and the following detailed description.

DETAILED DESCRIPTION

As stated earlier, when designing a digital filter with a wide frequency ratio, large coefficient word sizes are necessary in order to prevent undesired gain error in the filter response, typically at the lowest of frequencies in the design frequency band. The present disclosure includes a method and apparatus in which the size of the coefficient word may be reduced while avoiding the undesired gain error, thereby resulting in a savings of both hardware resources and cost. The method may sometimes be referred to herein as "Q Warping", although the name is not intended to limit the aspects of the disclosure in any way.

A digital filter as discussed herein may be a biquad digital filter. As is known in the art, a biquad (from "biquadratic") digital filter may be used for implementing second order filter types including, but not limited to, a low pass filter, high pass filter, band pass filter, band reject filter, low shelf filter, high shelf filter, etc. The digital filter may be an audio filter, video filter, or other type of filter and may be used in, for example, cell phones, radios, transmitters, receivers, motor controllers, etc. A biquad digital filter is not limited to second order filter types. A biquad digital filter may be transformed into any filter type with any filter Q and any filter corner/center frequency by, for instance, changing a set of (typically five or six, but not limited thereto) pre-calculated coefficients or coefficient words. The word size of the pre-calculated coefficients is typically a critical parameter since it determines both the gain accuracy at the lowest frequency of the operating frequency range and also determines the data path width of the hardware (usually the limiting feature is the input of the hardware multipliers) used in implementing the biquad digital filter.

In an embodiment of the present disclosure, and as discussed in more detail below, the biquad filter coefficients (coefficient words) are calculated and the resulting gain error is analyzed. If the gain error is greater than a predetermined amount, then the Q is "warped" (i.e., slightly altered) until the gain error is reduced to an acceptable amount. Typically, Q warping is only necessary for the lowest frequencies in a frequency range, although the present disclosure is not necessarily limited to operating only in the lowest frequencies in an operating frequency range. The methodology and apparatus discussed below can be used for any frequency. In an embodiment, frequencies that have a ratio of greater than 150:1 lower than the Nyquist limit frequency are Q warped when reducing the coefficient word size from 32 bits to 18 bits.

Figure 1:
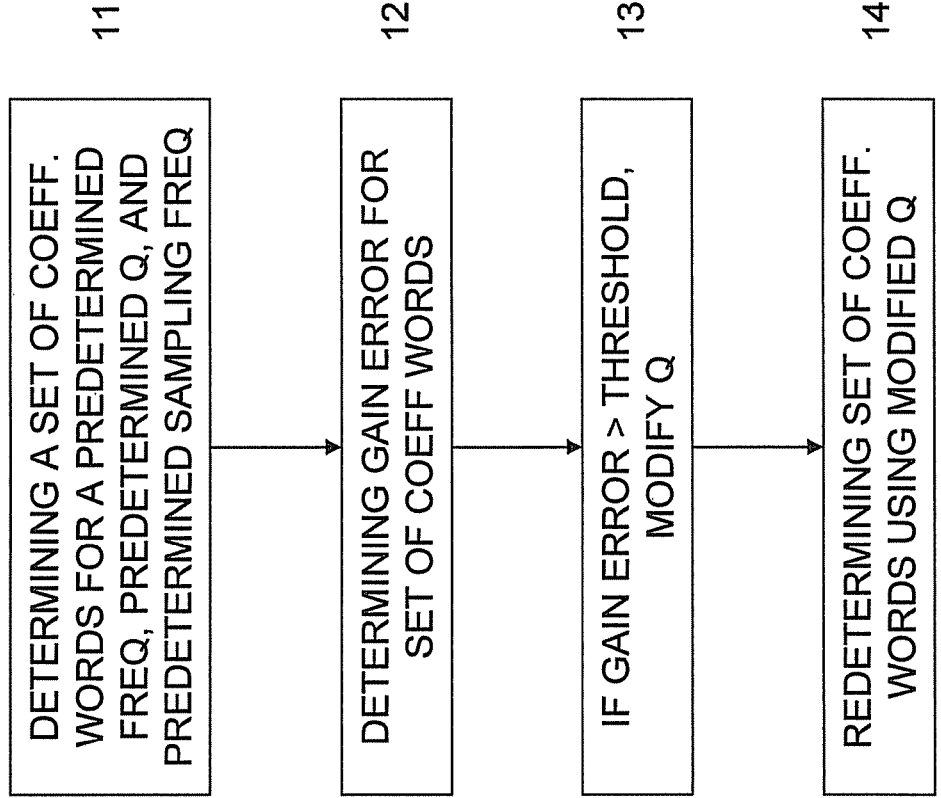
FIG. 1 is a flow diagram for determining a set of coefficient words for a digital filter according to an embodiment of the disclosure.

With reference now to FIG. 1, a flow diagram is shown for determining a set of coefficient words for a digital filter according to an embodiment of the disclosure. The digital filter, in some embodiments, may be an audio digital filter operating in a frequency range of approximately 20 Hz to 20 KHz. In block 11, a set of coefficient words are determined for a digital filter for a set of operating conditions which may include a predetermined frequency, a predetermined quality factor ("Q"), and a predetermined sampling frequency. The predetermined frequency may be a corner frequency or a center frequency for the digital filter. For an embodiment of the present disclosure, the predetermined sampling frequency may be, but is not limited to, 48 KHz. At block 12, the gain error is determined for the set of coefficient words and at block 13, the determined gain error is compared with a gain error threshold value. In an embodiment, the gain error threshold value may be 0.5 dB, although one of skill in the art will readily recognize that the present disclosure is operable with other gain error threshold values. If the determined gain error is greater than the threshold value, then the Q is modified. The Q modification may be by a predetermined amount or the Q modification may be a function of one of the operating parameters, the value of the gain error, or some other criteria. The predetermined amount by which the Q is modified may be, but is not limited to, an amount that is less than or equal to one percent of the Q value. At block 14 the modified Q value is used to determine a new set of coefficient words.

In embodiments of the disclosure, the set of coefficient words may include any number of coefficient words, for example five coefficient words. Likewise, a coefficient word may be a predetermined number of bits, for example eighteen bits. The predetermined number of bits may be chosen based on the maximum bit width of components that are incorporated in hardware for the digital filter. For example, a field programmable gate array ("FPGA") may include a multiplier with an input bit width of eighteen bits. Therefore, it would be advantageous to limit the coefficient words used with this FPGA to eighteen bits as any additional bits would require the use of an additional multiplier which would increase the cost of the FPGA.

Figure 2:
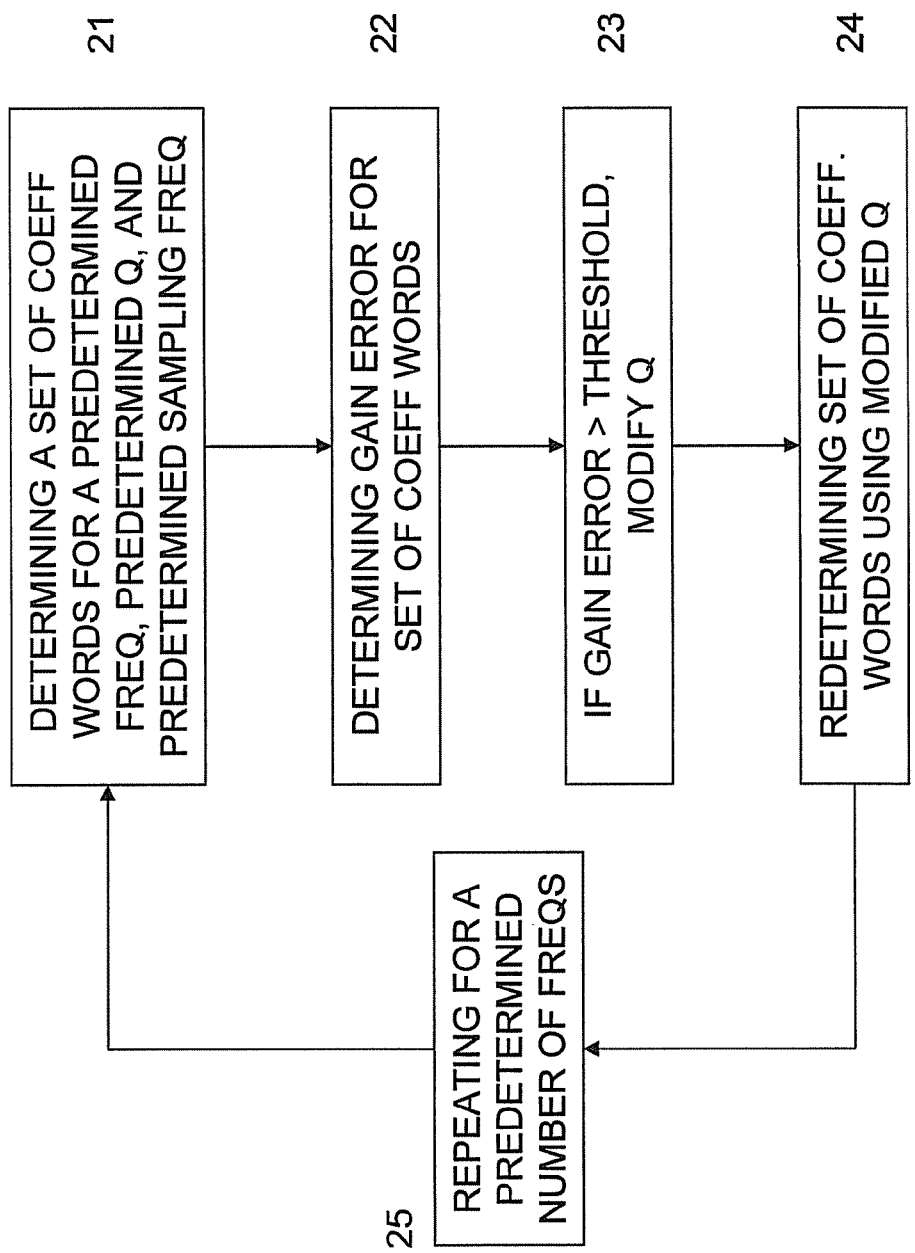
FIG. 2 is a flow diagram for iteratively determining a set of coefficient words for a digital filter according to an embodiment of the disclosure.

With attention to FIG. 2, a flow diagram is shown similar to the flow diagram for FIG. 1 where blocks 21, 22, 23, and 24 correspond to blocks 11, 12, 13, and 14, respectively, as discussed above. FIG. 2 further includes block 25 for iteratively determining a set of coefficient words for the digital filter. According to an embodiment of the disclosure, the redetermined set of coefficient words are used for repeating blocks 21 through 24, which may be done for a predetermined number of frequencies.

Figure 3:
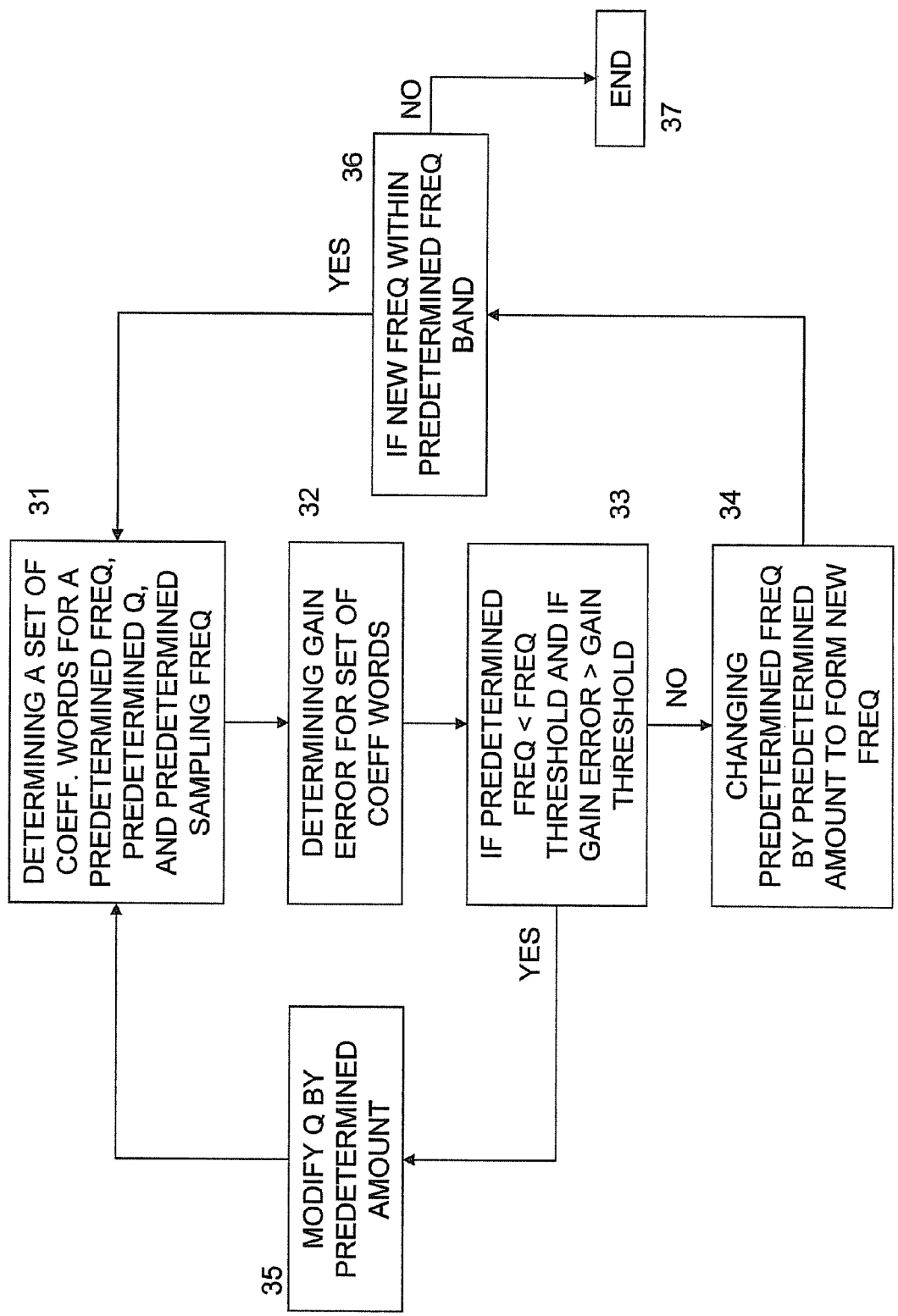
FIG. 3 is another flow diagram for iteratively determining a set of coefficient words for a digital filter according to an embodiment of the disclosure.

FIG. 3 presents another flow diagram for iteratively determining a set of coefficient words for a digital filter according to an embodiment of the disclosure. At block 31, a set of coefficient words may be determined for a predetermined frequency, a predetermined quality factor ("Q"), and a predetermined sampling frequency. The predetermined frequency may be a corner frequency or a center frequency for the digital filter. At block 32 a gain error for the digital filter is determined for the set of coefficient words. At block 33, the predetermined frequency is compared to a predetermined frequency threshold and the determined gain error is compared to a predetermined gain error threshold. The predetermined frequency threshold may be, but is not limited to, 160 Hz. The predetermined gain error threshold may be, but is not limited to, 0.5 dB. If the predetermined frequency is less than the predetermined frequency threshold and the determined gain error is greater than the predetermined gain error threshold, then at block 35 the Q value may be modified. The Q modification may be made by a predetermined amount or the Q modification may be a function of one of the operating parameters, the value of the gain error, or some other criteria. The predetermined amount by which the Q is modified may be, but is not limited to, an amount that is less than or equal to one percent of the Q value. The modified Q value may then be used as input back to block 31 to determine a new set of coefficient words (where the modified Q value may be substituted for the predetermined Q value in block 31).

If the predetermined frequency is not less than the predetermined frequency threshold or the determined gain error is not greater than the predetermined gain error threshold, then at block 34 the predetermined frequency value may be changed resulting in a new frequency value. The amount of the change in frequency value may be a predetermined amount or as a function of some other operating parameter. At block 36, a determination is made as to whether the new frequency value is within a predetermined frequency band. If the new frequency is not within the predetermined frequency band, then the process may end at block 37. If the new frequency is within the predetermined frequency band, then the new frequency may be used as an input back to block 31 to determine a new set of coefficient words (where the new frequency may be substituted for the predetermined frequency in block 31).

Figure 4:
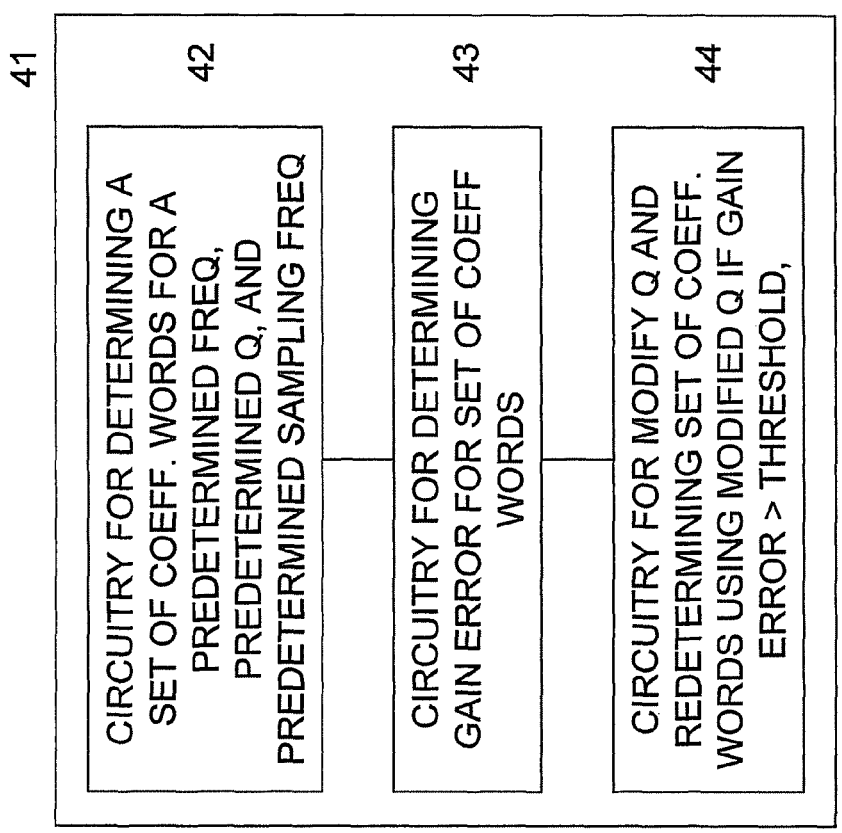
FIG. 4 is a block diagram of circuitry for determining a set of coefficient words for a digital filter according to an embodiment of the disclosure.

Looking now at FIG. 4, a block diagram is presented identifying components for determining a set of coefficient words for a digital filter according to an embodiment of the disclosure. As will be readily understood by those of skill in the art, the components represented in the block diagram may be implemented via circuitry, software, hardware, or a combination of any two or three of the foregoing. While the following discussion is directed towards a hardware implementation, those of skill in the art will readily understand that this is not to be construed as limiting the disclosure to only a hardware implementation. A digital filter 41, which may be a biquad digital filter as discussed herein and may be an audio filter operating in a frequency range of approximately 20 Hz to 20 KHz, and which may be implemented using an FPGA or other means known in the art, may include circuitry 42 for determining a set of coefficient words for a predetermined frequency, a predetermined quality factor ("Q"), and a predetermined sampling frequency. The set of coefficient words may be, but is not limited to, five coefficient words and each coefficient word may be, but is not limited to, eighteen bits. The predetermined frequency may be a corner frequency or a center frequency for the digital filter. The predetermined sampling frequency may be, but is not limited to, 48 KHz. Also included in the digital filter 41 may be circuitry for determining a gain error for the set of coefficient words determined by circuitry 42. Additionally, the digital filter 41 may include circuitry 44 for modifying the Q value and redetermining a set of coefficient words using the modified Q value if the gain error determined by circuitry 43 is greater than a gain error threshold, which may be, but is not limited to, 0.5 dB. The amount of modification of the Q value may be a predetermined amount and may be less than or equal to one percent of the Q value.

Figure 5:
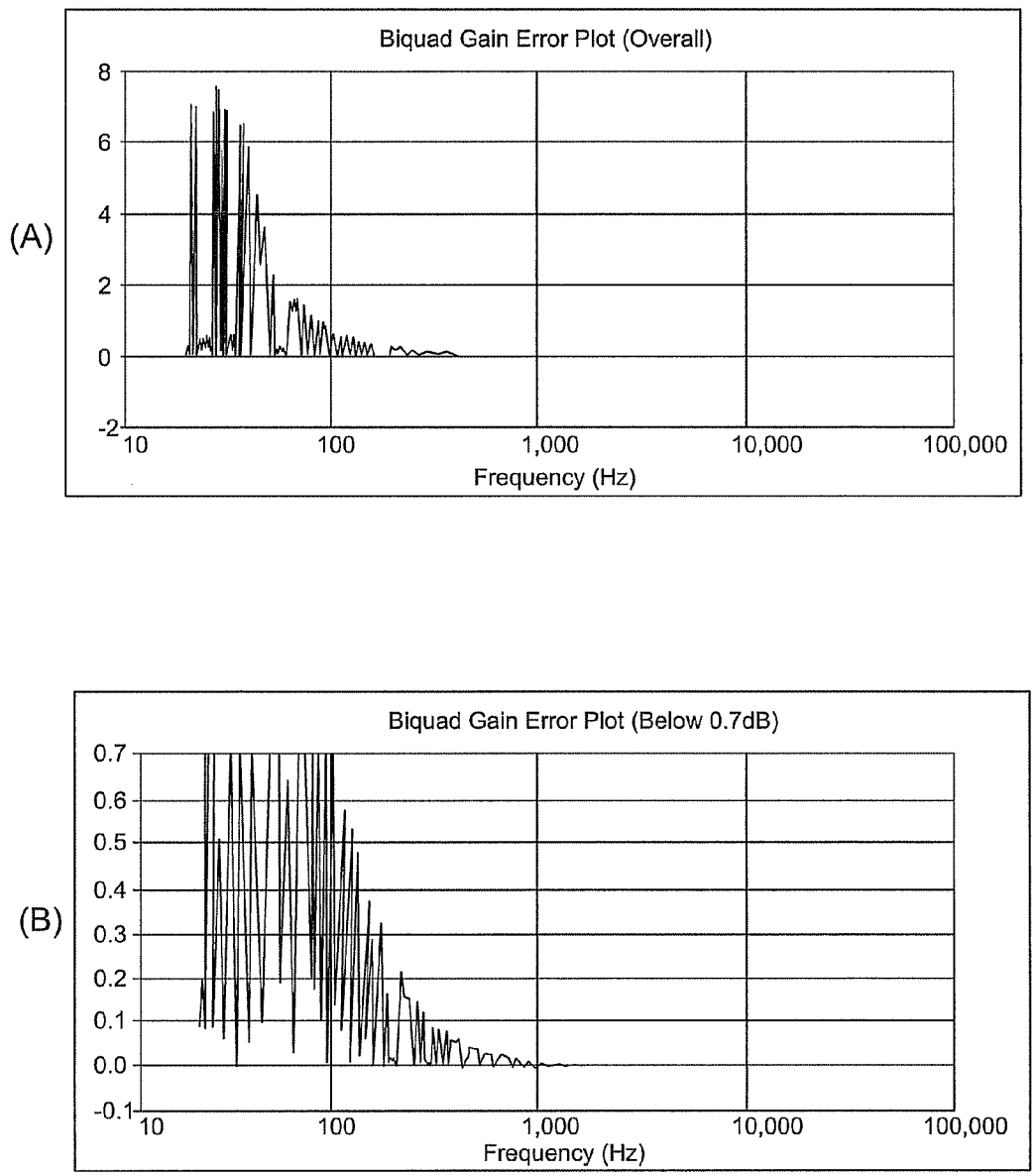
FIG. 5 (A) and (B) are graphs of gain error for a digital filter before implementing the techniques of the present disclosure.
Figure 6:
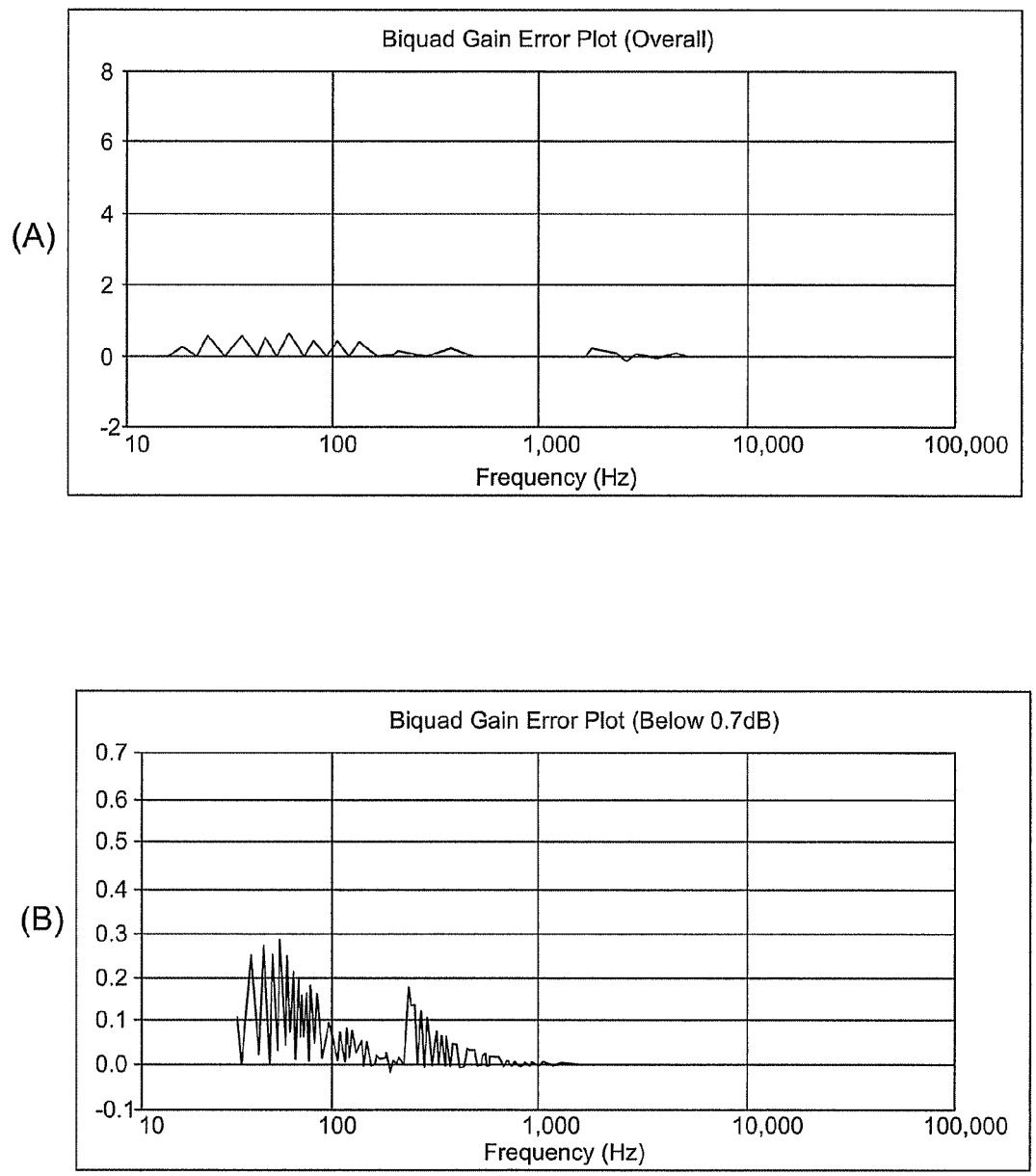
FIG. 6 (A) and (B) are graphs of gain error for a digital filter after implementing the techniques of the present disclosure.

To show an example of an improvement in gain error using the methodologies and/or apparatus discussed herein, a comparison of gain errors in FIGS. 5(A) and 5(B) with FIGS. 6(A) and 6(B) is instructive. FIGS. 5(A) and 5(B) are graphs of gain error for a digital filter before implementing the techniques of the present disclosure. FIGS. 6(A) and 6(B) are graphs of gain error for a digital filter after implementing the techniques of the present disclosure. Each of the four graphs plots gain error in dB versus frequency in Hz. The data plotted in FIGS. 5(A) and 5(B) are the same, the only difference being the scale along the vertical (gain error) axis. In FIG. 5(A), the gain error is plotted between 0-8 dB while in FIG. 5(B), the gain error is plotted between 0-0.7 dB. Similarly for FIGS. 6(A) and 6(B) where in FIG. 6(A), the gain error is plotted between 0-8 dB while in FIG. 6(B), the gain error is plotted between 0-0.7 dB. The data shown is for a high pass biquad digital filter with a sample rate of 48 KHz where frequencies that have a ratio of greater than 150:1 lower than the Nyquist limit frequency are Q warped when reducing the coefficient word size from 32 bits to 18 bits. As can be readily seen from a comparison of FIGS. 5(A), 5(B), 6(A), and 6(B), before Q warping the gain error was as high as approximately 7.5 dB whereas after Q warping the gain error was reduced to approximately 0.34 dB.

While preferred embodiments of the present disclosure have been described, it is to be understood that the embodiments described are illustrative only and that the scope of the invention is to be defined solely by the appended claims when accorded a full range of equivalents, many variations and modifications naturally occurring to those of skill in the art from a perusal hereof.

We claim:

1. A method for determining a set of coefficient words for a digital filter, comprising:
   a. determining a set of coefficient words for said digital filter for a predetermined frequency, a predetermined quality factor, and a predetermined sampling frequency;
   b. determining a gain error value for said digital filter for said set of coefficient words; and
   c. if said determined gain error value is greater than a predetermined threshold, modifying said quality factor by a predetermined amount and redetermining said set of coefficient words for said digital filter using said modified quality factor
   wherein the steps of determining the set of coefficient words, determining the gain error value and redetermining said set of coefficient words are performed by a processor.

2. The method of claim 1 wherein (a) through (c) are repeated for a predetermined number of frequencies.

3. The method of claim 1 wherein said set of coefficient words includes five coefficient words.

4. The method of claim 1 wherein said digital filter is biquad digital filter.

5. The method of claim 1 wherein said digital filter is selected from the group consisting of: low pass filter, high pass filter, band pass filter, band reject filter, low shelf filter, and high shelf filter.

6. The method of claim 1 wherein said predetermined frequency is a corner frequency or a center frequency for said digital filter.

7. The method of claim 1 wherein said predetermined threshold is 0.5 dB.

8. The method of claim 1 wherein said predetermined amount is less than or equal to one percent of said quality factor.

9. The method of claim 1 wherein at least one of said coefficient words comprises eighteen bits.

10. The method of claim 1 wherein said predetermined sampling frequency is either 44.1 KHz or 48 KHz.

11. The method of claim 1 wherein said digital filter is an audio digital filter.

12. The method of claim 11 wherein a frequency range for said audio digital filter is approximately 20 Hz to 20 kHz.

13. A method for determining sets of coefficient words for a digital filter, comprising:
   a. determining a set of coefficient words for said digital filter for a predetermined frequency value, a predetermined quality factor, and a predetermined sampling frequency;
   b. determining a gain error value for said digital filter for said set of coefficient words;
   c. if said predetermined frequency value is less than a predetermined frequency threshold and said determined gain error value is greater than a predetermined gain error threshold, modifying said quality factor by a first predetermined amount and repeating (a) through (c) using said modified quality factor; and
   d. changing said predetermined frequency value by a second predetermined amount to thereby form a new frequency value and repeating (a) through (d) using said new frequency value if said new frequency value is within a predetermined frequency band so as to determine a set of coefficient words for said digital filter;
   wherein the steps of determining the set of coefficient words, determining the gain error value and determining said set of coefficient words are performed by a processor.

14. The method of claim 13 wherein said set of coefficient words includes five coefficient words.

15. The method of claim 13 wherein said digital filter is a biquad digital filter.

16. The method of claim 13 wherein said digital filter is selected from the group consisting of: low pass filter, high pass filter, band pass filter, band reject filter, low shelf filter, and high shelf filter.

17. The method of claim 13 wherein said predetermined frequency is a corner frequency or a center frequency for said digital filter.

18. The method of claim 13 wherein said predetermined gain error threshold is 0.5 dB.

19. The method of claim 13 wherein said first predetermined amount is less than or equal to one percent of said quality factor.

20. The method of claim 13 wherein said coefficient words have a predetermined number of bits.

21. The method of claim 20 wherein said predetermined number of bits is eighteen.

22. The method of claim 13 wherein said predetermined sampling frequency is either 44.1 KHz or 48 KHz.

23. The method of claim 13 wherein said digital filter is an audio digital filter.

24. The method of claim 13 wherein said predetermined frequency threshold is 160 Hz.

25. An apparatus for determining a set of coefficient words for a digital filter, comprising:
    said digital filter;
    circuitry for determining a set of coefficient words for said digital filter for a predetermined frequency, a predetermined quality factor, and a predetermined sampling frequency; circuitry for determining a gain error value for said digital filter for said set of coefficient words; and
    circuitry for modifying said quality factor by a predetermined amount and redetermining said set of coefficient words using said modified quality factor if said determined gain error value is greater than a predetermined threshold.

26. The apparatus for claim 25 wherein said set of coefficient words includes five coefficient words.

27. The apparatus of claim 25 wherein said digital filter is a biquad digital filter.

28. The apparatus of claim 25 wherein said digital filter is selected from the group consisting of: low pass filter, high pass filter, band pass filter, band reject filter, low shelf filter, and high shelf filter.

29. The apparatus of claim 25 wherein said predetermined frequency is a corner frequency or a center frequency for said digital filter.

30. The apparatus of claim 25 wherein said predetermined threshold is 0.5 dB.

31. The apparatus of claim 25 wherein said predetermined amount is less than or equal to one percent of said quality factor.

32. The apparatus of claim 25 wherein at least one of said coefficient words comprises eighteen bits.

33. The apparatus f claim 25 wherein said predetermined sampling frequency is either 44.1 KHz or 48 KHz.

34. The apparatus of claim 25 wherein said digital filter is an audio digital filter.

35. The apparatus of claim 34 wherein a frequency range of said audio digital filter is approximately 20 Hz to 20 KHz.

36. A non-transitory computer readable medium having machine executable instructions for performing a method for determining a set of coefficient words for a digital filter, the method comprising:
    a. determining a set of coefficient words for said digital filter for a predetermined frequency, a predetermined quality factor, and a predetermined sampling frequency;
    b. determining a gain error value for said digital filter for said set of coefficient words; and
    c. if said determined gain error value is greater than a predetermined threshold, modifying said quality factor by a predetermined amount and redetermining said set of coefficient words using said modified quality factor so as to determine a set of coefficient words for said digital filter.

37. The method of claim 1, further comprising:
    changing the predetermined frequency by a predetermined amount to form a new frequency value and repeating (a) through (c) using the new frequency value if the new frequency value is within a predetermined frequency band to determine another set of coefficient words for the digital filter.

* * * * *